(12) United States Patent
Sato et al.

(10) Patent No.: US 11,495,457 B2
(45) Date of Patent: Nov. 8, 2022

(54) FILM FORMING METHOD

(71) Applicant: Tokyo Electron Limited, Tokyo (JP)

(72) Inventors: Jun Sato, Oshu (JP); Hiroyuki Kikuchi, Oshu (JP); Takehiro Fukada, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 141 days.

(21) Appl. No.: 16/991,236

(22) Filed: Aug. 12, 2020

(65) Prior Publication Data

US 2021/0050208 A1    Feb. 18, 2021

(30) Foreign Application Priority Data

Aug. 15, 2019    (JP) .............................. JP2019-149132

(51) Int. Cl.
*H01L 21/02*    (2006.01)
*H01L 21/762*   (2006.01)

(52) U.S. Cl.
CPC ...... *H01L 21/0234* (2013.01); *H01L 21/0228* (2013.01); *H01L 21/02164* (2013.01); *H01L 21/02211* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 6,271,100 B1 * | 8/2001 | Ballantine | H01L 21/76224 257/E21.546 |
| 2016/0362789 A1 * | 12/2016 | Yoshikawa | H01J 37/32779 |
| 2019/0055645 A1 * | 2/2019 | Li | H01L 21/02222 |
| 2020/0032389 A1 * | 1/2020 | Lei | C23C 16/45553 |

FOREIGN PATENT DOCUMENTS

JP    2012-255203 A    12/2012

* cited by examiner

*Primary Examiner* — Asok K Sarkar
(74) *Attorney, Agent, or Firm* — Nath, Goldberg & Meyer; Jerald L. Meyer; Tanya E. Harkins

(57) ABSTRACT

A film forming method includes adsorbing an aminosilane gas on a substrate having a recess in a surface of the substrate, depositing a silicon oxide film on the substrate by supplying an oxidizing gas to the substrate to oxidize the aminosilane gas adsorbed on the substrate, and performing a modifying process of the silicon oxide film by activating a mixed gas including nitrogen gas and hydrogen gas and supplying the activated mixed gas to the silicon oxide film.

13 Claims, 15 Drawing Sheets

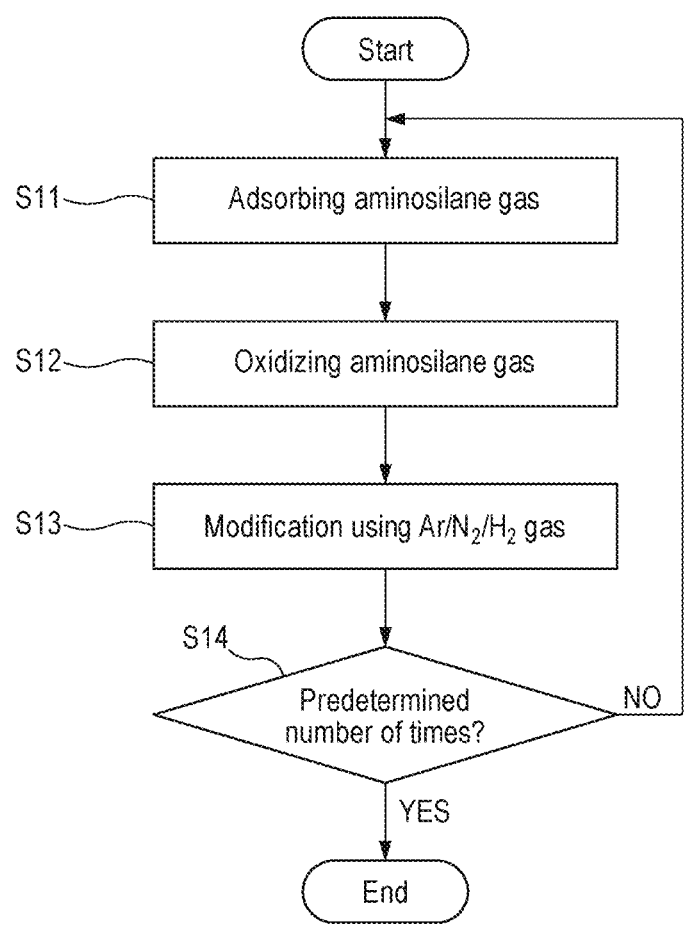

FILM FORMING METHOD

CROSS-REFERENCE TO RELATED APPLICATION

This application is based upon and claims the benefit of priority from Japanese Patent Application No. 2019-149132, filed on Aug. 15, 2019, the entire contents of which are incorporated herein by reference.

TECHNICAL FIELD

The present disclosure relates to a film forming method.

BACKGROUND

There is known a film forming method including: a step of adsorbing a first reaction gas on a substrate, a step of reacting the first reaction gas with a second reaction gas to so as to form a reaction product on the substrate, and a step of irradiating the reaction product with plasma generated by a hydrogen-containing gas (see, e.g., Patent Document 1).

PRIOR ART DOCUMENT

Patent Document

Patent Document 1: Japanese Laid-Open Patent Publication No. 2012-255203

SUMMARY

According to embodiments of the present disclosure, there is provided a film forming method including: adsorbing an aminosilane gas on a substrate having a recess in a surface of the substrate; depositing a silicon oxide film on the substrate by supplying an oxidizing gas to the substrate to oxidize the aminosilane gas adsorbed on the substrate; and performing a modifying process of the silicon oxide film by activating a mixed gas including nitrogen gas and hydrogen gas and supplying the activated mixed gas to the silicon oxide film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a view illustrating a flow of a film forming method according to an embodiment.

DETAILED DESCRIPTION

Figure 1:
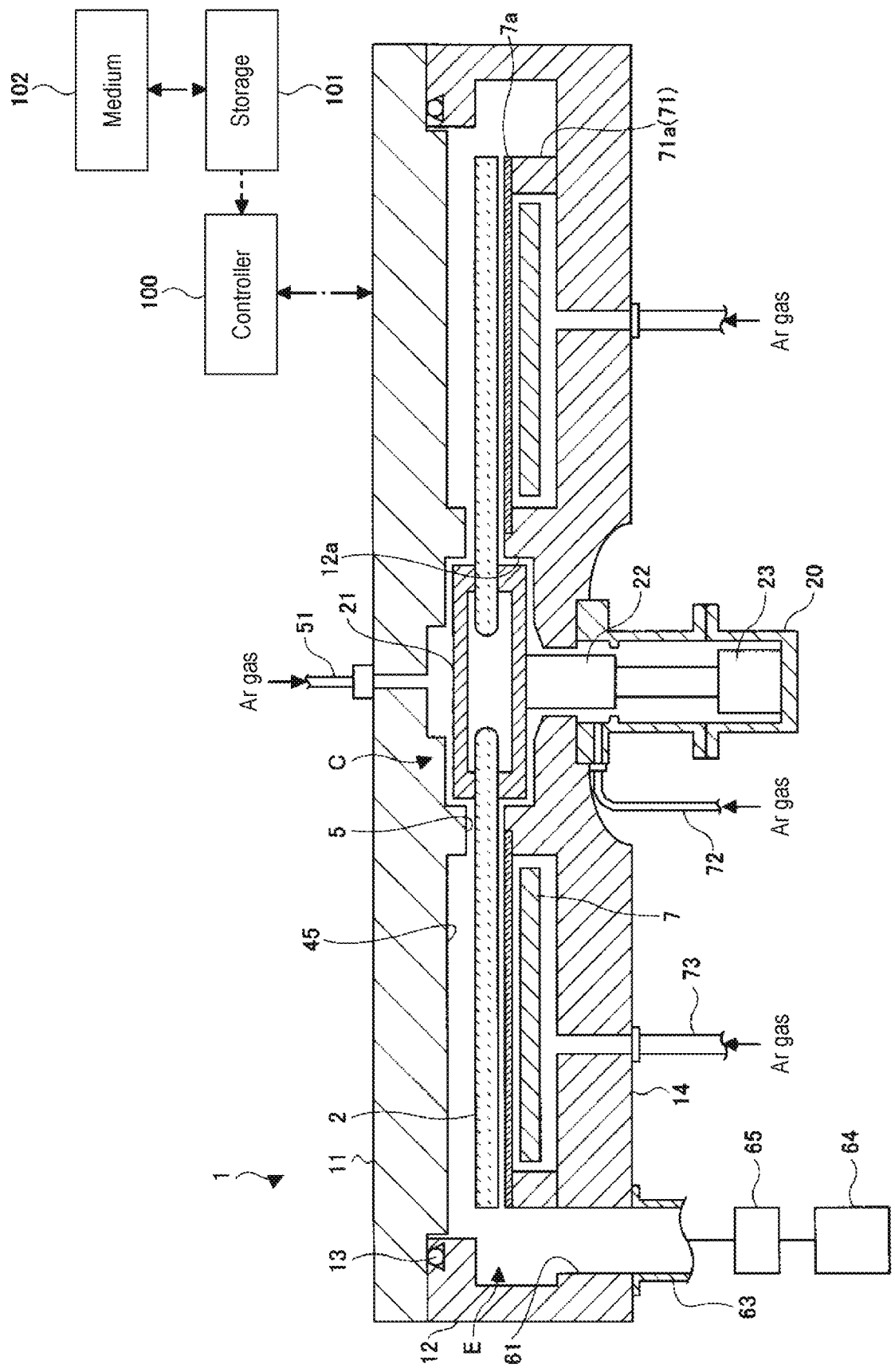
FIG. 1 is a cross-sectional view illustrating an exemplary configuration of a film forming apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant explanations will be omitted.

(Film Forming Apparatus)

Figure 2:
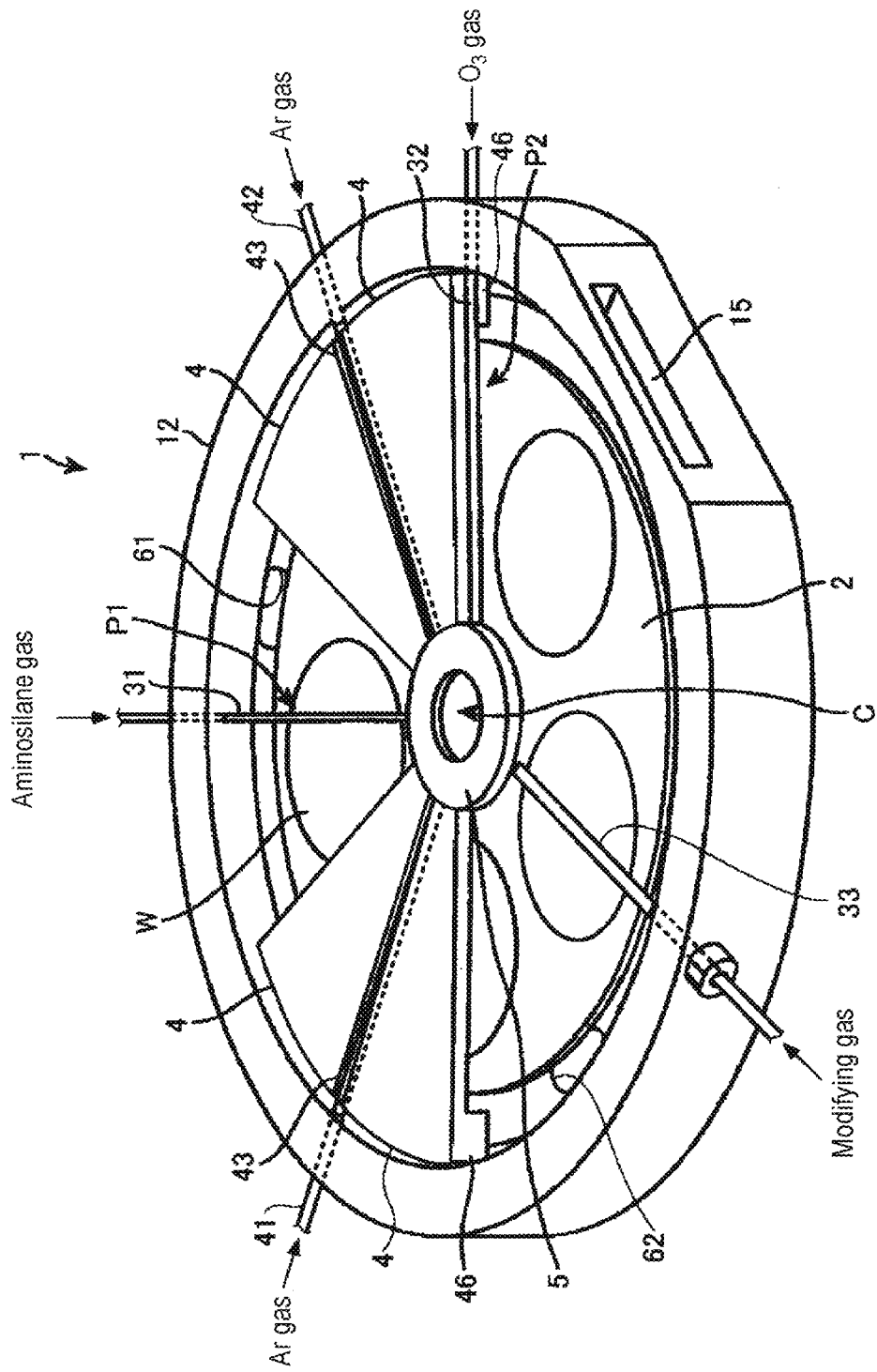
FIG. 2 is a perspective view illustrating the configuration within a vacuum container of the film forming apparatus of FIG. 1.
Figure 3:
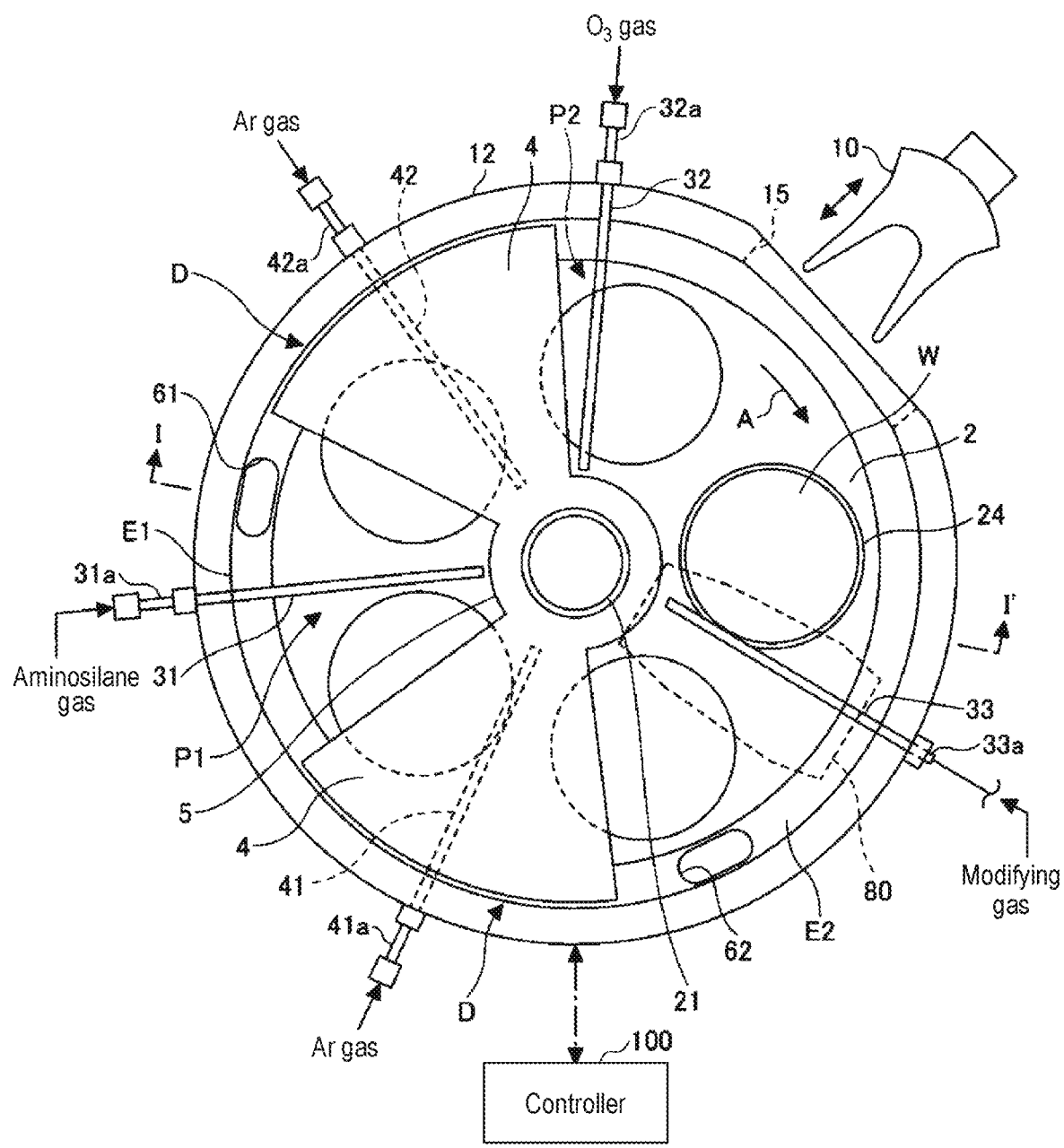
FIG. 3 is a plan view illustrating the configuration within the vacuum container of the film forming apparatus of FIG. 1.

A film forming apparatus suitable for performing a film forming method according to an embodiment will be described. Referring to FIGS. 1 to 3, a film forming apparatus includes a flat vacuum container 1 having a substantially circular plane shape, and a rotary table 2 provided in the vacuum container 1 and having a rotation center at the center of the vacuum container 1. The vacuum container 1 includes a container body 12 having a bottomed cylindrical shape, and a ceiling plate 11 hermetically and detachably mounted on the top surface of the container body 12 via, for example, a seal member 13 (see FIG. 1) such as an O-ring.

The rotary table 2 is fixed to a cylindrical core part 21 in the central portion thereof. The core part 21 is fixed to the upper end of a rotary shaft 22 extending in the vertical direction. The rotary shaft 22 penetrates the bottom portion 14 of the vacuum container 1, and its lower end is attached to a drive part 23 that rotates the rotary shaft 22 (see FIG. 1) around a vertical axis. The rotary shaft 22 and the drive part 23 are accommodated in a top-opened cylindrical case body 20. The case body 20 has a flange portion, which is provided on the upper surface thereof and is hermetically mounted on the bottom surface of the bottom portion 14 of the vacuum container 1, so that an airtight state between the inside atmosphere and the outside atmosphere of the case body 20 is maintained.

As illustrated in FIGS. 2 and 3, circular recesses 24 are provided in the surface of the rotary table 2 in order to place a plurality of (for example, five) semiconductor wafers (hereinafter referred to as "wafers W"), which are substrates, along the rotation direction (circumferential direction). In FIG. 3, a wafer W is illustrated in only one recess 24 for the sake of convenience. The recess 24 has an inner diameter (e.g., 4 mm) slightly larger than the diameter of the wafer W and a depth substantially equal to the thickness of the wafer W. Accordingly, when the wafer W is accommodated in the recess 24, the surface of the wafer W and the surface of the rotary table 2 (the area where no wafer W is placed) have the same height. In the bottom surface of the recess 24, through holes (not illustrated) are formed through which, for example, three lifting pins for supporting the rear surface of the wafer W and moving the wafer W up and down pass.

FIGS. 2 and 3 are views for explaining the internal structure of the vacuum container 1, and the ceiling plate 11 is not shown for convenience of description. As illustrated in FIGS. 2 and 3, above the rotary table 2, reaction gas nozzles 31, 32, and 33 and separation gas nozzles 41 and 42 made of, for example, quartz, are arranged in the circumferential direction of the vacuum container 1 (indicated by the arrow A in FIG. 3) to be spaced apart from each other in the rotation direction of the rotary table 2. In the illustrated example, a reaction gas nozzle 33, a separation gas nozzle 41, a reaction gas nozzle 31, a separation gas nozzle 42, and a reaction gas nozzle 32 are arranged in that order in a clockwise direction (rotation direction of the rotary table 2) from a transfer port 15 described later. Gas introduction ports 31a, 32a, 33a, 41a, and 42a (see FIG. 3), which are respective base end portions of the reaction gas nozzles 31, 32, and 33 and the separation gas nozzles 41 and 42, are fixed to the outer peripheral wall of the container body 12. Then, the reaction gas nozzles 31, 32, and 33 and the separation gas nozzles 41 and 42 are introduced into the vacuum container 1 from the outer peripheral wall of the vacuum container 1 and extend horizontally with respect to the rotary table 2 in the radial direction of the container body 12.

A plasma generation source 80 is provided above the reaction gas nozzle 33 as illustrated in a simplified manner by the broken line in FIG. 3. The plasma generation source 80 will be described later.

The reaction gas nozzle 31 is connected to an aminosilane gas supply source (not illustrated) via, for example, a pipe and a flow rate controller (not illustrated). As the aminosilane gas, for example, diisopropylaminosilane (DIPAS) gas, trisdimethylaminosilane (3DMAS) gas, and bis-tertiary butylaminosilane (BTBAS) may be used.

The reaction gas nozzle 32 is connected to an oxidizing gas supply source (not illustrated) via, for example, a pipe and a flow rate controller (not illustrated). As the oxidizing gas, for example, ozone ($O_3$) gas may be used.

The reaction gas nozzle 33 is connected to a modifying gas supply source (not illustrated) via, for example, a pipe and a flow rate controller (not illustrated). As the modifying gas, for example, argon (Ar) gas, nitrogen ($N_2$) gas, and hydrogen ($H_2$) gas may be used.

Each of the separation gas nozzles 41 and 42 is connected to a separation gas supply source (not shown) via, for example, a pipe and a flow rate control valve (not illustrated). As the separation gas, for example, Ar gas or nitrogen ($N_2$) gas may be used.

Each of the reaction gas nozzles 31 and 32 is provided with a plurality of ejection holes 31h or 32h (see FIG. 4) opening toward the rotary table 2 along the lengthwise direction thereof at an interval of, for example, 10 mm. An area below the reaction gas nozzle 31 is an aminosilane gas adsorption area P1 for adsorbing an aminosilane gas on the wafers W. An area below the reaction gas nozzle 32 is an oxidizing gas supply area P2 for oxidizing the aminosilane gas adsorbed on the wafers W in the aminosilane gas adsorption area P1. The structure of the reaction gas nozzle 33 not illustrated in FIG. 4 will be described later.

Referring to FIGS. 2 and 3, two convex portions 4 are provided in the vacuum container 1. The convex portions 4 are formed on the rear surface of the ceiling plate 11 so as to protrude toward the rotary table 2 in order to form separation areas D together with the separation gas nozzles 41 and 42. In addition, each of the convex portions 4 has a fan-shaped planar shape in which the top portion is cut into an arc shape, and in an embodiment, the inner arc is connected to a protrusion 5 (described later) and the outer arc is disposed along the inner peripheral surface of the container body 12 of the vacuum container 1.

Figure 4:
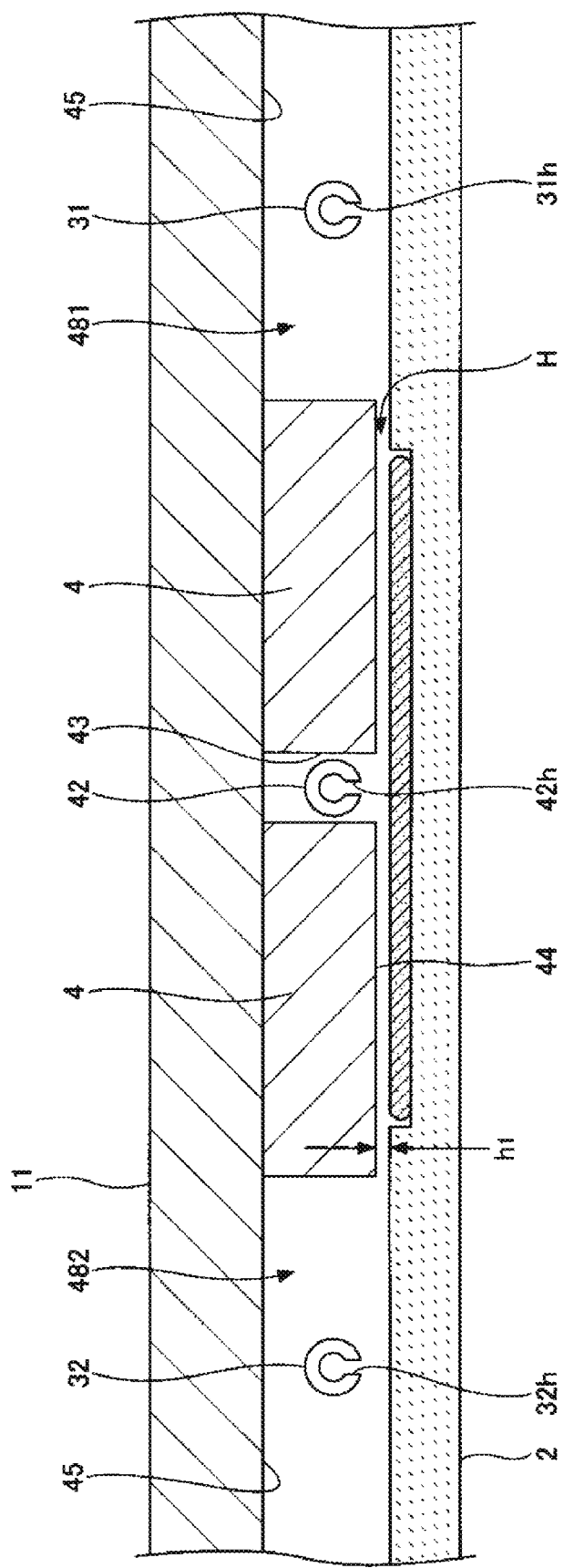
FIG. 4 is a cross-sectional view of the vacuum container taken along a concentric circle of a rotary table rotatably provided within the vacuum container of the film forming apparatus of FIG. 1.

FIG. 4 shows a cross section of the vacuum container 1 taken along a concentric circle of the rotary table 2 from the reaction gas nozzle 31 to the reaction gas nozzle 32. As illustrated in FIG. 4, the convex portions 4 are formed on the rear surface of the ceiling plate 11. Therefore, in the vacuum container 1, there are flat low ceiling surfaces (first ceiling surfaces 44) which are the bottom surfaces of the convex portions 4 and ceiling surfaces (second ceiling surfaces 45) located on both sides in the circumferential direction of the first ceiling surfaces 44 to be higher than the first ceiling surfaces 44. Each of the first ceiling surfaces 44 has a fan-shaped planar shape of which the top portion is cut in an arc shape. In addition, as illustrated, in each of the convex portions 4, a groove 43 formed to extend in the radial direction is formed at the center thereof in the circumferential direction, and the separation gas nozzle 42 is accommodated in the groove 43. A groove 43 is similarly formed in the other convex portion 4, and the separation gas nozzle 41 is accommodated in the groove 43. In addition, the reaction gas nozzles 31 and 32 are provided in the spaces below the second ceiling surfaces 45, respectively. These reaction gas nozzles 31 and 32 are provided near the wafers W apart from the second ceiling surfaces 45. As illustrated in FIG. 4, the reaction gas nozzle 31 is provided in a space 481 below the second ceiling surface 45 on the right side of the convex portions 4, and the reaction gas nozzle 32 is provided in a space 482 below the second ceiling surface 45 on the left side of the convex portions 4.

In addition, the separation gas nozzle 42, which is accommodated in the groove 43 of the convex portion 4, is provided with a plurality of ejection holes 42h (see FIG. 4) opening toward the rotary table 2 along the lengthwise direction thereof at an interval of, for example, 10 mm. In addition, the separation gas nozzle 41, which is accommodated in the groove 43 of another convex portion 4, is also provided with a plurality of ejection holes 41h opening toward the rotary table 2 along the lengthwise direction thereof at an interval of, for example, 10 mm.

The first ceiling surface 44 forms a separation space H, which is a narrow space, with respect to the rotary table 2. When Ar gas is supplied from the ejection holes 42h of the separation gas nozzle 42, the Ar gas flows toward the spaces 481 and 482 through the separation space H. At this time, since the volume of the separation space H is smaller than the volume of each of the spaces 481 and 482, the pressure of the separation space H can be made higher than the pressure of the spaces 481 and 482 by the Ar gas. That is, the separation space H having a high pressure is formed between the spaces 481 and 482. Further, the Ar gas flowing out from the separation space H into the spaces 481 and 482 acts as a counter flow against the aminosilane gas from the aminosilane gas adsorption area P1 and the oxidizing gas from the oxidizing gas supply area P2. Accordingly, the aminosilane gas from the aminosilane gas adsorption area P1 and the oxidizing gas from the oxidizing gas supply area P2 are separated by the separation space H. Accordingly, the mixing and reaction of the aminosilane gas and the oxidizing gas in the vacuum container 1 are suppressed.

The height h1 of the first ceiling surface 44 with respect to the upper surface of the rotary table 2 is set to a level suitable for making it higher than the pressure of the spaces 481 and 482 in consideration of, for example, the pressure inside the vacuum container 1, the rotation speed of the rotary table 2, and the flow rate of the separation gas (Ar gas).

On the other hand, the bottom surface of the ceiling plate 11 is provided with a protrusion 5 (see FIGS. 2 and 3) surrounding the outer periphery of the core part 21 which fixes the rotary table 2. In an embodiment, the protrusion 5 is continuous with the rotation center side portions of the convex portions 4, and the bottom surface thereof is formed at the same height as the first ceiling surface 44.

Figure 5:
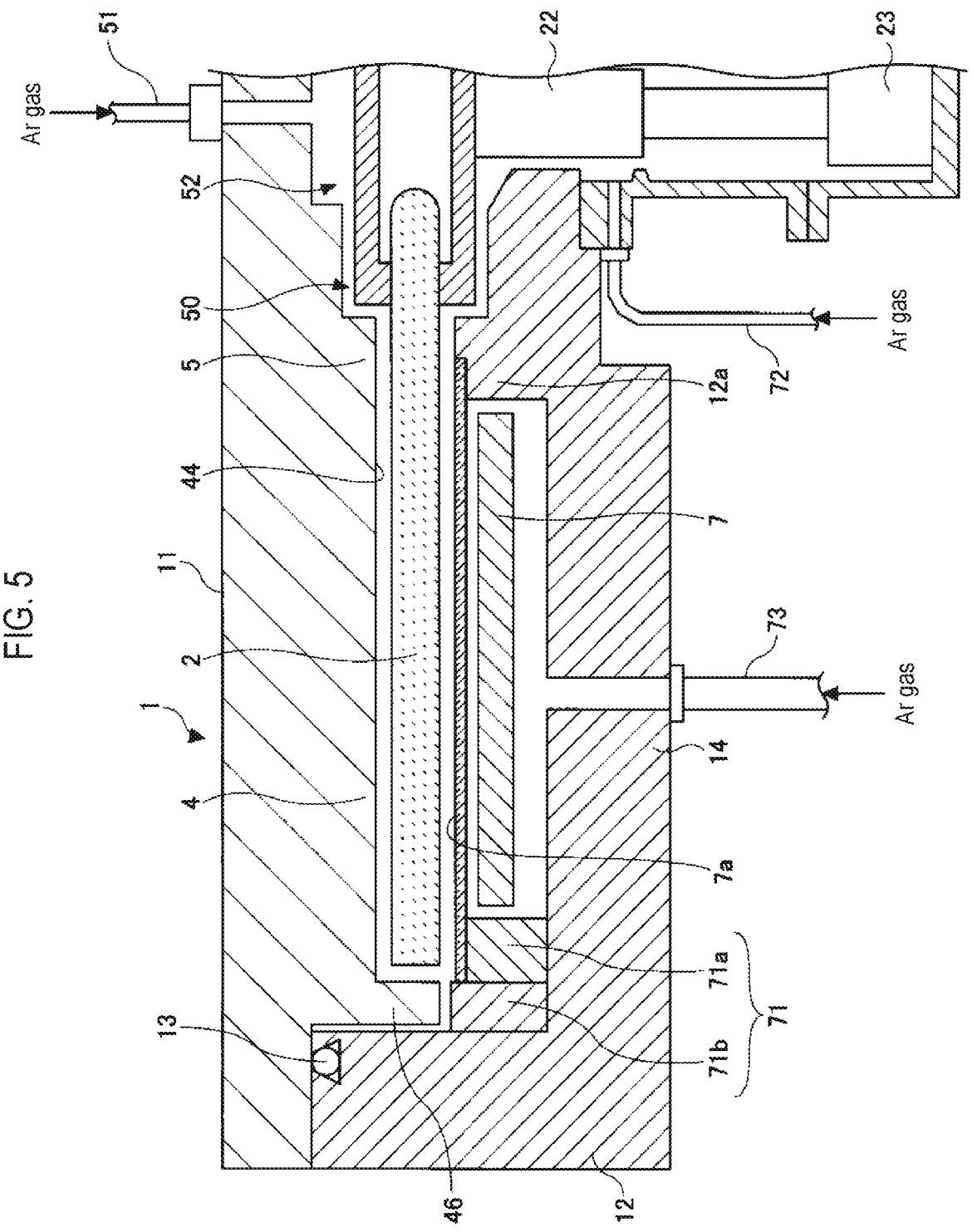
FIG. 5 is another cross-sectional view of the film forming apparatus of FIG. 1.

FIG. 1 is a cross-sectional view taken along the line I-I' in FIG. 3, and shows the area in where the second ceiling surface 45 is provided. On the other hand, FIG. 5 is a cross-sectional view illustrating the area in which the first ceiling surface 44 is provided. As illustrated in FIG. 5, at the peripheral edge of the fan-shaped convex portion 4 (the outer edge side portion of the vacuum container 1), a bent portion 46, which is bent in an L shape, is formed to face the outer end surface of the rotary table 2. Similar to the convex portion 4, the bent portion 46 suppresses the reaction gas from entering from both sides of the separation areas D, and thus suppresses the mixing of the aminosilane gas and the oxidizing gas. Since the fan-shaped convex portion 4 is provided on the ceiling plate 11 such that the ceiling plate 11 can be separated from the container body 12, there is a slight gap between the outer peripheral surface of the bent portion 46 and the container body 12. The gap between the inner peripheral surface of the bent portion 46 and the outer end surface of the rotary table 2 and the gap between the outer peripheral surface of the bent portion 46 and the container body 12 are set to a dimension similar to the height of the first ceiling surface 44 with respect to the top surface of the rotary table 2.

In the separation area D, the inner peripheral wall of the container body 12 is formed to be a vertical surface close to the outer peripheral surface of the bent portion 46 (see FIG. 5). In the portion other than the separation area D, the inner peripheral wall of the container body 12 is recessed toward the outside from the portions facing the outer end surface of the rotary table 2 including the bottom portion 14 (see FIG. 1). Hereinafter, for convenience of description, the recessed portion having a substantially rectangular cross-sectional shape will be referred to as exhaust area E. Specifically, the exhaust area communicating with the aminosilane gas adsorption area P1 will be referred to as a first exhaust area E1, and the area communicating with the oxidizing gas supply area P2 will be referred to as a second exhaust area E2. As illustrated in FIGS. 1 to 3, a first exhaust port 61 and a second exhaust port 62 are formed in the bottom portions of the first exhaust area E1 and the second exhaust area E2, respectively. As illustrated in FIG. 1, each of the first exhaust port 61 and the second exhaust port 62 is connected to, for example, a vacuum pump 64, which is a vacuum exhaust part, via an exhaust pipe 63. FIG. 1 also illustrates a pressure controller 65.

As illustrated in FIGS. 1 and 5, a heater unit 7, which is a heating part, is provided in the space between the rotary table 2 and the bottom portion 14 of the vacuum container, so that the wafers W on the rotary table 2 are heated to a temperature (e.g., 400 degrees C.) determined by a process recipe via the rotary table 2. An annular cover member 71 is provided below the periphery of the rotary table 2 (see FIG. 5). The cover member 71 separates the atmosphere from the first exhaust area E1 to the second exhaust area E2 of the space above the rotary table 2 from the atmosphere in which the heater unit 7 is placed, so as to suppress gas infiltration into the area below the rotary table 2. The cover member 71 includes an inner member 71a provided to face, from below, the outer edge of the rotary table 2 and the outer peripheral side outside the outer edge, and an outer member 71b provided between the inner member 71a and the inner peripheral surface of the vacuum member 1. The outer member 71b is provided below the bent portion 46, formed on the outer edge of the convex portion 4 in the separation area D, to be adjacent to the bent portion 46. The inner member 71a covers the entire circumference of the heater unit 7 below the outer edge of the rotary table 2 (and below a portion slightly outside the outer edge).

A portion of the bottom portion 14 closer to the center of rotation than the space in which the heater unit 7 is disposed protrudes upward so as to approach the core part 21 in the vicinity of the central portion of the bottom surface of the rotary table 2 and form a protrusion 12a. A narrow space is formed between the protrusion 12a and the core part 21, and a gap between the inner peripheral surface of the through hole for the rotary shaft 22 penetrating the bottom portion 14 and the rotary shaft 22 is narrow. These narrow spaces communicate with the case body 20. The case body 20 is provided with a purge gas supply pipe 72 for supplying Ar gas, which is a purge gas, into the narrow spaces so as to purge the narrow spaces. In addition, a plurality of purge gas supply pipes 73 for purging the space in which the heater unit 7 is disposed are provided in the bottom portion 14 of the vacuum container 1 below the heater unit 7 at a predetermined angular interval in the circumferential direction (FIG. 5 illustrates one purge gas supply pipe 73). In addition, between the heater unit 7 and the rotary table 2, in order to suppress the infiltration of gas into the area in which the heater unit 7 is provided, a lid member 7a is provided to cover the space between the inner peripheral wall of the outer member 71b (the top surface of the inner member 71a) and the upper end of the protrusion 12a in the circumferential direction. The lid member 7a is made of, for example, quartz.

Further, a separation gas supply pipe 51 is connected to the central portion of the ceiling plate 11 of the vacuum container 1 so that Ar gas, which is a separation gas, is supplied to the space 52 between the ceiling plate 11 and the core part 21. The separation gas supplied to the space 52 is ejected toward the peripheral edge along the surface of the wafer mounting area of the rotary table 2 through the narrow gap 50 between the protrusion 5 and the rotary table 2. The gap 50 may be maintained at a higher pressure than the spaces 481 and 482 by the separation gas. Therefore, the gap 50 prevents the aminosilane gas supplied to the aminosilane gas adsorption area P1, and the oxidizing gas supplied to the oxidizing gas supply area P2 from mixing through the central area C. That is, the gap 50 (or the central area C) functions similarly to the separation space H (or the separation area D).

In addition, as illustrated in FIGS. 2 and 3, in the side wall of the vacuum container 1, a transfer port 15 is formed to deliver a wafer W between an external transfer arm 10 and the rotary table 2. The transfer port 15 is opened and closed by a gate valve (not illustrated). Below the rotary table 2, in a portion corresponding to a wafer W delivery position, there are provided delivery lift pins (not illustrated) penetrating through each recess 24 for lifting a wafer W from the rear surface of the wafer W, and a lift mechanism thereof (not illustrated).

Figure 6:
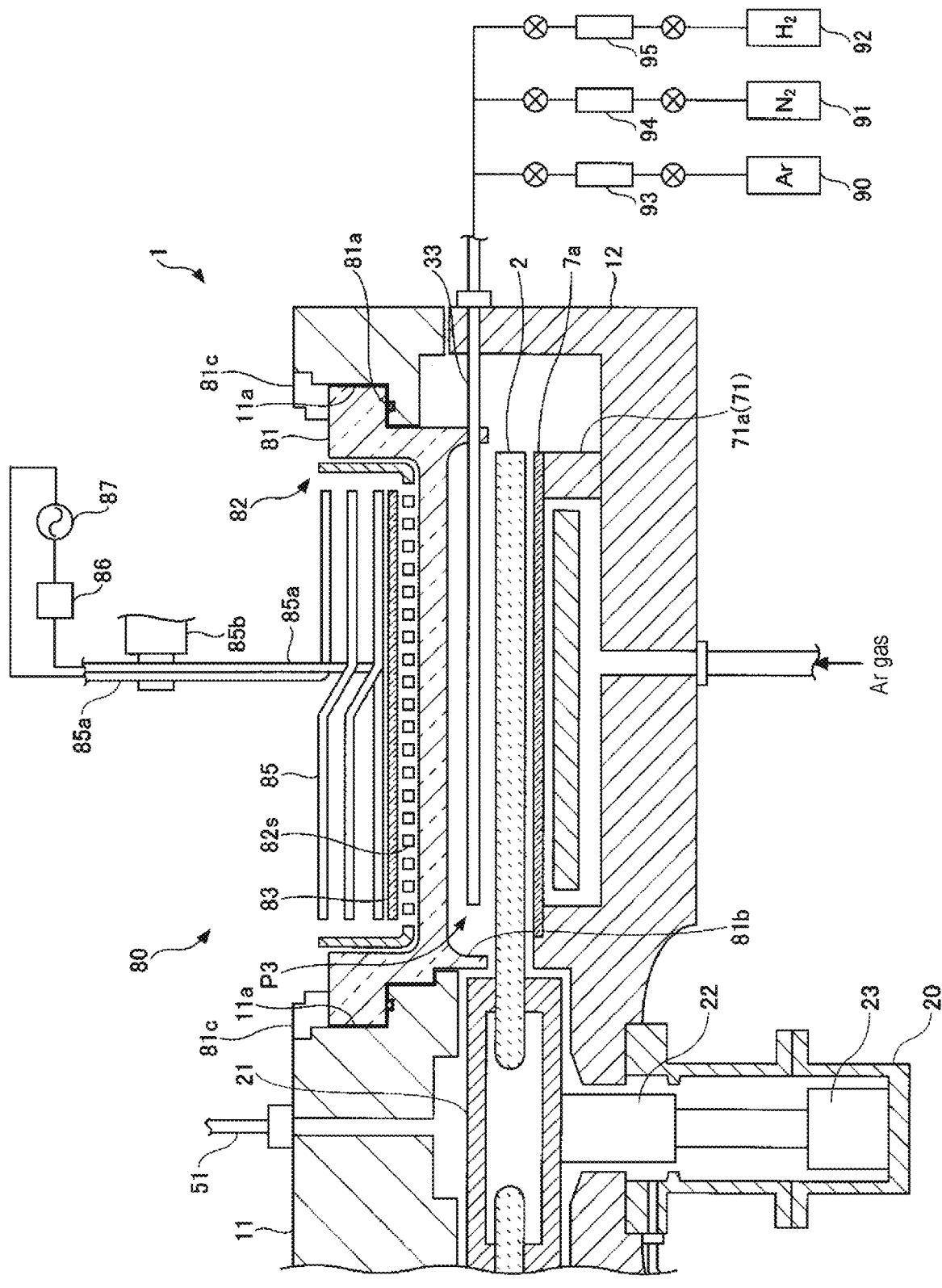
FIG. 6 is a cross-sectional view of a plasma generation source provided in the film forming apparatus of FIG. 1.
Figure 7:
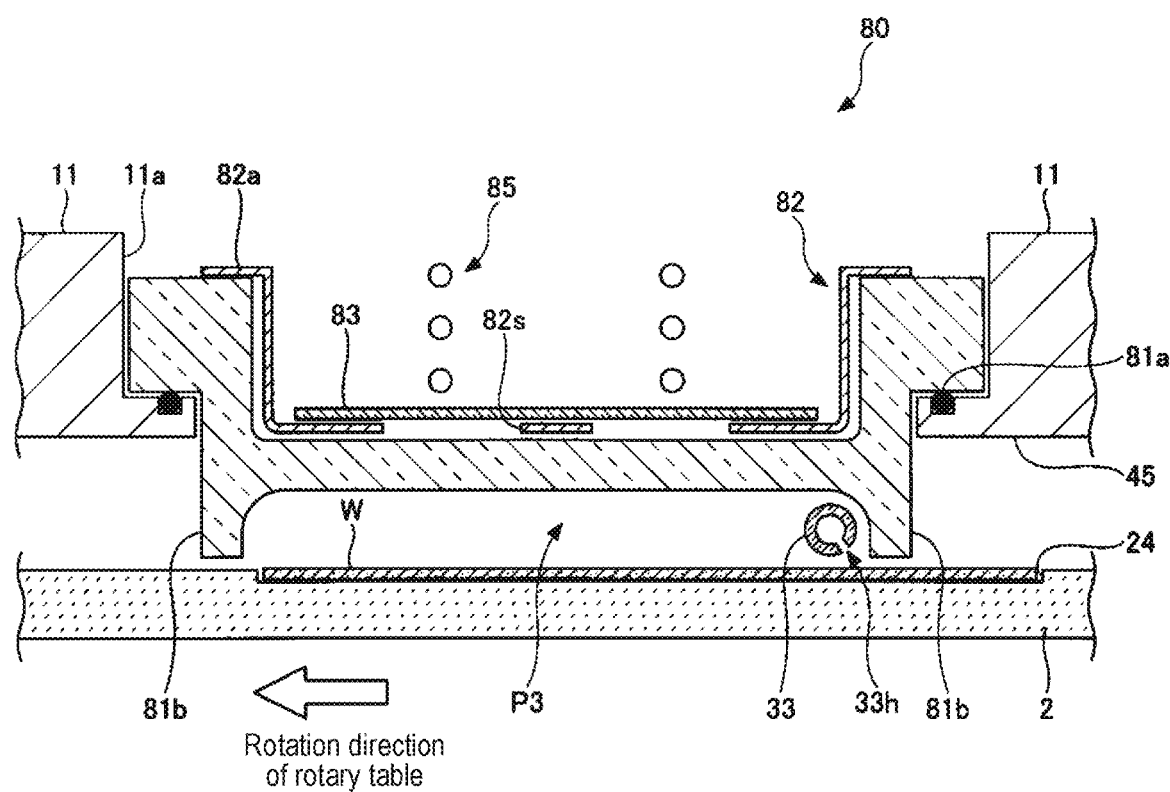
FIG. 7 is another cross-sectional view of the plasma generation source provided in the film forming apparatus of FIG. 1.
Figure 8:
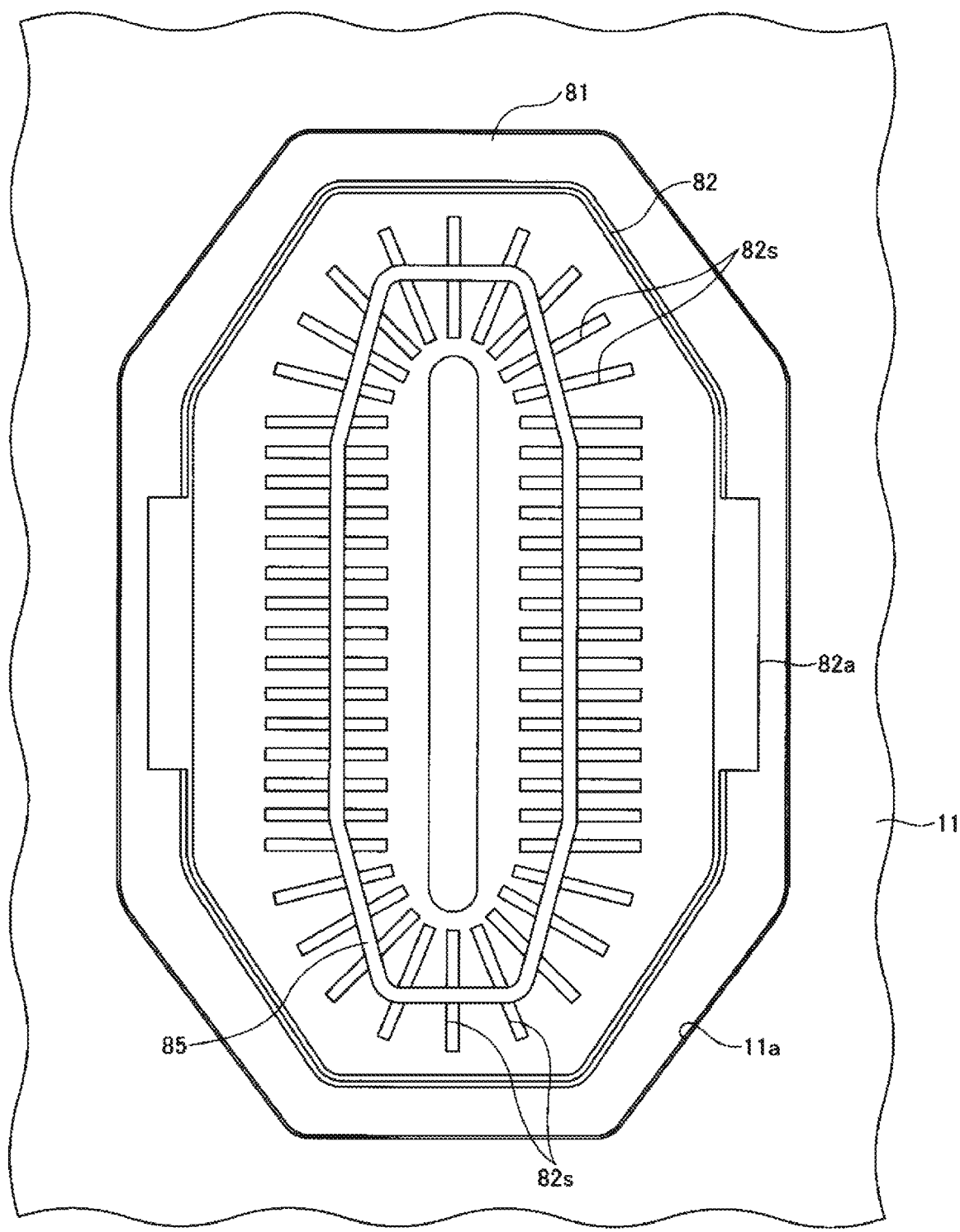
FIG. 8 is a top view of the plasma generation source provided in the film forming apparatus of FIG. 1.

Next, a plasma generation source 80 will be described with reference to FIGS. 6 to 8. FIG. 6 is a cross-sectional view of the plasma generation source 80 provided in the film forming apparatus of FIG. 1, and illustrates a cross section of the plasma generation source 80 along the radial direction of the rotary table 2. FIG. 7 is another cross-sectional view of the plasma generation source 80 provided in the film forming apparatus of FIG. 1, and illustrates a cross section of the plasma generation source 80 along a direction orthogonal to the radial direction of the rotary table 2. FIG. 8 is a top view of the plasma generation source 80 provided in the film forming apparatus of FIG. 1. For convenience of illustration, some members are simplified in these drawings.

Referring to FIG. 6, the plasma generation source 80 includes a frame member 81, a Faraday shield 82, an insulating plate 83, and an antenna 85. The frame member 81 is made of a high-frequency transparent material, has a recess recessed from the top surface thereof, and is fitted into an opening 11a formed in the ceiling plate 11. The Faraday shield 82 is accommodated in the recess in the frame member 81, and the upper portion of the Faraday shield has a substantially top-opened box-like shape. The insulating plate 83 is arranged on the bottom surface of the Faraday shield 82. The antenna 85 is supported above the insulating plate 83 and is formed in a coil shape having a substantially octagonal planar shape.

The opening 11a in the ceiling plate 11 has a plurality of steps, one of which has a groove formed over the entire circumference thereof, and a seal member 81a such as an O-ring is fitted into the groove. On the other hand, the frame member 81 has a plurality of steps corresponding to the steps of the opening 11a. Accordingly, when the frame member 81 is fitted into the opening 11a, the rear surface of one of the plurality of steps comes into contact with the seal member 81a fitted into the groove in the opening 11a, and thus the airtightness between the ceiling plate 11 and the frame member 81 is maintained. Further, as illustrated in FIG. 6, a pressing member 81c is provided along the outer periphery of the frame member 81 fitted into the opening 11a in the ceiling plate 11, whereby the frame member 81 is pressed downward against the ceiling plate 11. Therefore, the airtightness between the ceiling plate 11 and the frame member 81 is more reliably maintained.

The bottom surface of the frame member 81 faces the rotary table 2 in the vacuum container 1, and a protrusion 81b protruding downward (toward the rotary table 2) is provided on the entire outer circumference of the bottom surface of the frame member 81. The bottom surface of the protrusion 81b is close to the surface of the rotary table 2, and a plasma processing area P3 is defined above the rotary table 2 by the protrusion 81b, the surface of the rotary table 2, and the bottom surface of the frame member 81. The distance between the bottom surface of the protrusion 81b and the surface of the rotary table 2 may be substantially the same as the height h1 of the first ceiling surface 44 in the separation space H (see FIG. 4) with respect to the top surface of the rotary table 2.

Further, in the plasma processing area P3, the reaction gas nozzle 33 passing through the protrusions 81b extends. In an embodiment, as illustrated in FIG. 6, the reaction gas nozzle 33 is connected to an argon gas supply source 90 filled with Ar gas, a nitrogen gas supply source 91 filled with $N_2$ gas, and a hydrogen gas supply source 92 filled with $H_2$ gas. From the argon gas supply source 90, the nitrogen gas supply source 91, and the hydrogen gas supply source 92, Ar gas, $N_2$ gas, and $H_2$ gas, of which the flow rates are controlled by the corresponding flow rate controllers 93, 94 and 95, are supplied to the plasma processing area P3 at a predetermined flow rate ratio (mixture ratio).

The reaction gas nozzle 33 has a plurality of ejection holes 33h formed along the lengthwise direction at a predetermined interval (e.g., 10 mm), and the above-mentioned Ar gas, $N_2$ gas, and $H_2$ gas are discharged from the ejection holes 33h. As illustrated in FIG. 7, the ejection holes 33h are inclined from the direction perpendicular to the rotary table 2 toward the upstream side in the rotational direction of the rotary table 2. Therefore, the mixed gas supplied from the reaction gas nozzle 33 is ejected in the direction opposite the rotation direction of the rotary table 2, specifically, toward the gap between the bottom surface of the protrusion 81b and the surface of the rotary table 2. As a result, the oxidizing gas and the separation gas are prevented from flowing into the plasma processing area P3 from the space below the second ceiling surface 45 located upstream of the plasma generation source 80 in the rotation direction of the rotary table 2. As described above, since the protrusion 81b formed along the outer periphery of the bottom surface of the frame member 81 is close to the surface of the rotary table 2, the pressure in the plasma processing area P3 can be easily maintained to be high by the gas from the reaction gas nozzle 33. This also prevents the oxidizing gas and the separation gas from flowing into the plasma processing area P3.

The Faraday shield 82 is made of a conductive material such as metal and is grounded although not shown. As clearly illustrated in FIG. 8, a plurality of slits 82s are formed in the bottom portion of the Faraday shield 82. Each slit 82s extends substantially orthogonal to the corresponding side of the antenna 85 having a substantially octagonal planar shape.

As illustrated in FIGS. 7 and 8, the Faraday shield 82 has support portions 82a that are bent outward at two locations on the upper end. Since the support portions 82a are supported on the top surface of the frame member 81, the Faraday shield 82 is supported at a predetermined position in the frame member 81.

The insulating plate 83 is made of, for example, quartz glass, has a size slightly smaller than the bottom surface of the Faraday shield 82, and is placed on the bottom surface of the Faraday shield 82. The insulating plate 83 insulates the Faraday shield 82 from the antenna 85, and transmits high-frequency waves radiated from the antenna 85 downward.

The antenna 85 is formed by, for example, triple-winding a copper hollow tube (pipe) such that its planar shape becomes an octagon. Cooling water can be circulated in the pipe, which prevents the antenna 85 from being heated to a high temperature by the high-frequency waves supplied to the antenna 85. The antenna 85 is provided with a standing portion 85a, and a support portion 85b is attached to the standing portion 85a. By the support portion 85b, the antenna 85 is maintained at a predetermined position inside the Faraday shield 82. A high-frequency power supply 87 is electrically connected to the support portion 85b via a matching box 86. The high-frequency power supply 87 generates high-frequency waves having a frequency of, for example, 13.56 MHz.

According to the plasma generation source 80, when high-frequency power is supplied from the high-frequency power supply 87 to the antenna 85 via the matching box 86, the antenna 85 generates an electromagnetic field. The electric field component of the electromagnetic field cannot propagate downward by being blocked by the Faraday shield 82. On the other hand, the magnetic field component propagates into the plasma processing area P3 through the plurality of slits 82s in the Faraday shield 82. Due to the magnetic field component, plasma is generated from a modifying gas supplied from the reaction gas nozzle 33 to the plasma processing area P3 at a predetermined flow rate ratio (mixing ratio). With the plasma thus generated, it is possible to reduce, for example, irradiation damage to a thin film deposited on the wafer W and damage to each member in the vacuum container 1.

As illustrated in FIG. 1, the film forming apparatus is provided with a controller 100 including a computer for controlling the operation of the entire apparatus. In the memory of the controller 100, a program for causing the film forming apparatus to perform a film forming method described later is stored under the control of the controller 100. The program includes a group of steps assembled to execute the film forming method described below. The program is stored in a medium 102 such as a hard disc, a compact disc, a magneto-optical disc, a memory card, or a flexible disc, is read into a storage 101 by a predetermined reading device, and is installed in the controller 100.

(Film Forming Method)

Figure 10A:
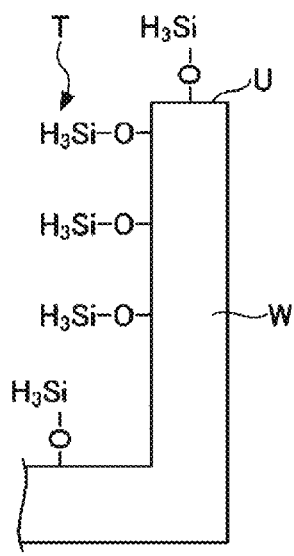
FIGS. 10A to 10D are schematic views for describing the film forming method of an embodiment.

A film forming method according to an embodiment will be described by taking a case where a silicon oxide film ($SiO_2$ film) is formed using the above-described film forming apparatus as an example. FIG. 9 is a view illustrating a flow of a film forming method according to an embodiment. FIGS. 10A to 10D are schematic views for describing the film forming method of an embodiment. In an embodiment, as shown in FIG. 10A, a case where a silicon oxide film is buried and formed in a trench T of a wafer W having the trench T formed in the surface thereof will be described as an example. The trench T is an example of a recess formed in the surface U of the wafer W, and, for example, a via hole may be formed in addition to the trench T. A base film such as a silicon nitride film may be formed on the surface of the wafer W.

First, the gate valve is opened, and a wafer W is delivered from the outside to a recess 24 in the rotary table 2 by the transfer arm 10 via the transfer port 15. The delivery of the wafer W is performed by raising and lowering the lifting pins from the bottom side of the vacuum container 1 through the through holes in the bottom surface of the recess 24 when the recess 24 stops at the position facing the transfer port 15. Such delivery of wafers W is performed by intermittently rotating the rotary table 2, and a wafer W is placed in each of the five recesses 24 in the rotary table 2.

Next, the gate valve is closed and the inside of the vacuum container 1 is evacuated to a vacuum level that can be reached by the vacuum pump 64. Thereafter, Ar gas is ejected as a separation gas from the separation gas nozzles 41 and 42 at a predetermined flow rate, and Ar gas is ejected from the separation gas supply pipe 51 and the purge gas supply pipe 72 at a predetermined flow rate. Further, the pressure controller 65 controls the inside of the vacuum container 1 to a preset processing pressure. Next, each wafer W is heated to, for example, 400 degrees C. by the heater unit 7 while rotating the rotary table 2 clockwise at a rotation speed of, for example, 5 rpm.

Thereafter, an aminosilane gas is supplied from the reaction gas nozzle 31, and $O_3$ gas is supplied from the reaction gas nozzle 32. Further, $Ar/N_2/H_2$ gas is supplied from the reaction gas nozzle 33, and high-frequency waves having a frequency of 13.56 MHz are supplied to the antenna 85 of the plasma generation source 80 using electric power of, for example, 4000 W. As a result, plasma is generated in the plasma processing area P3 between the plasma generation source 80 and the rotary table 2. NH active species and high-energy particles are generated in the plasma.

Figure 10B:
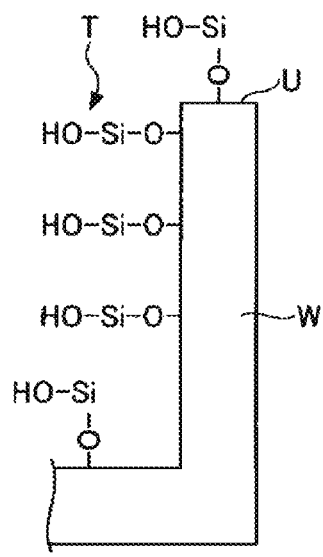

The wafer W repeatedly passes through the aminosilane gas adsorption area P1, the separation area D, the oxidizing gas supply area P2, the plasma processing area P3, and the separation area D in that order by the rotation of the rotary table 2. In the aminosilane gas adsorption area P1, $SiH_3$ groups are generated on the surface U of the wafer W and the inner surface of the trench T as illustrated in FIG. 10A (step S11). After passing through the separation area D, $SiH_3$ groups generated on the surface U of the wafer W and/or the inner surface of the trench T are oxidized by $O_3$ gas molecules in the oxidizing gas supply area P2 (step S12). As a result, as illustrated in FIG. 10B, hydroxyl groups (OH groups) are generated along the inner surface of the trench T.

Figure 10C:
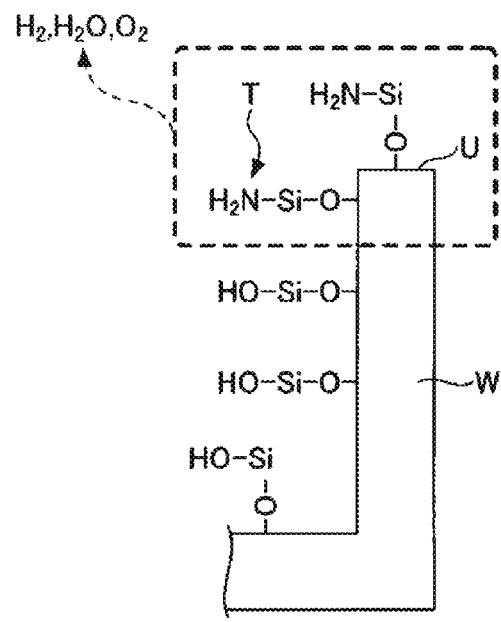

Next, when the wafer W reaches the plasma processing area P3 of the plasma generation source 80, the wafer W is exposed to the plasma generated by the $Ar/N_2/H_2$ gas (step S13). At this time, some of the OH groups are replaced with amino groups ($NH_2$ groups) by collision of NH active species contained in the plasma. The plasma reaches the surface U of the wafer W and the vicinity of the opening of the trench T, but does not easily reach the vicinity of the bottom of the trench T. Therefore, on the front surface U of the wafer W and the side surface of the trench T near the opening, a relatively large amount of OH groups are replaced with $NH_2$ groups. As a result, as illustrated in FIG. 10C, OH groups are distributed such that the density of OH groups is high at the bottom portion of the trench T and the side surface near the bottom portion, and the density becomes low toward the opening of the trench T and the surface U of the wafer W.

Figure 10D:
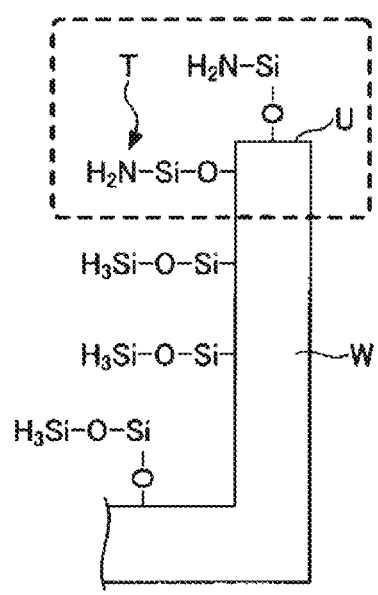

Next, when the wafer W again reaches the aminosilane gas adsorption area P1 by the rotation of the rotary table 2, molecules of the aminosilane gas supplied from the reaction gas nozzle 31 are adsorbed on the surface U of the wafer W and/or the inner surface of the trench T. At this time, the molecules of the aminosilane gas are likely to be adsorbed to the OH groups and unlikely to be adsorbed to the $NH_2$ groups. Therefore, as illustrated in FIG. 10D, the molecules of the aminosilane gas are adsorbed to the surface U of the wafer W and/or the inner surface of the trench T showing a distribution according to the distribution of OH groups. That is, the molecules of the aminosilane gas are adsorbed to the inner surface of the trench T such that the density is high at the bottom portion of the trench T and the side surface near the bottom portion, and the density decreases toward the opening of the trench T.

Subsequently, when the wafer W passes through the oxidizing gas supply area P2, the aminosilane gas adsorbed on the surface U of the wafer W and/or the inner surface of the trench T is oxidized by $O_3$ gas, and a silicon oxide film is further formed. At this time, the film thickness distribution of the silicon oxide film reflects the density of the aminosilane gas adsorbed to the inner surface of the trench T. That is, the silicon oxide film becomes thicker on the bottom portion of the trench T and on the side surface near the bottom portion, and becomes thinner toward the opening of the trench T. Further, the OH groups generated by the oxidation of the aminosilane gas are adsorbed to the surface of the silicon oxide film.

Then, when the wafer W reaches the plasma processing area P3 of the plasma generation source 80 again, as described above, the OH groups are distributed such that the density of OH groups is high on the bottom portion of the trench T and the side surface near the bottom portion, and the density decreases toward the opening of the trench T.

Thereafter, when the above-described process is repeated, the silicon oxide film becomes thicker from the bottom portion of the trench T. As the silicon oxide film becomes thicker, the trench T is filled with the silicon oxide film without forming voids, and the filling of the trench T is completed.

As described above, according to the film forming method of the embodiment, in the process of modifying a silicon oxide film 111 performed in the plasma processing area P3, Ar/$N_2$/$H_2$ gas as a modifying gas is activated by plasma. This makes it possible to form a silicon oxide film in which a seam is unlikely to occur by the subsequent etching process. A mechanism, in which a silicon oxide film in which a seam is unlikely to occur by a subsequent etching step can be formed by activating Ar/$N_2$/$H_2$ gas as a modifying gas with plasma and supplying the activated gas, and an implementation result thereof will be described later.

In the above film forming method, the case where Ar/$N_2$/$H_2$ gas is activated by plasma and supplied to perform the process of modifying the silicon oxide film has been illustrated. However, the mixed gas used for the modifying process may be another mixed gas as long as it contains $N_2$ gas and $H_2$ gas. For example, He/$N_2$/$H_2$ gas containing He gas instead of Ar gas or Ar/He/$N_2$/$H_2$ gas containing He gas in addition to Ar gas may be used. Even in this case, as in the film forming method described above, NH active species are generated by activating the mixed gas with plasma.

(Mechanism)

The mechanism in which Ar/$N_2$/$H_2$ gas as a modifying gas is activated by plasma and is supplied to form a silicon oxide film in which a seam is unlikely to occur by a subsequent etching step will be described.

First, the modifying gas activated by the plasma generated by the plasma generation source 80 will be described. Generally, when a silicon oxide film is formed using an aminosilane gas as a source gas, OH groups serve as adsorption sites, and the aminosilane gas is adsorbed on the OH groups. However, when a recess is formed in the surface of a wafer W and a film is formed to be buried in the recess, bottom-up film formation (V-shaped film formation) in which film formation gradually progresses upward from the bottom surface of the recess is preferred in order to prevent formation of voids inside the recess caused by closing the upper opening of the recess.

When a mixed gas of $H_2$ gas and $O_2$ gas (hereinafter referred to as "$H_2$/$O_2$ gas") as a modifying gas is activated by plasma, a film having a good film quality can be formed, but OH groups, which are adsorption sites for an aminosilane gas, are formed on the top surface of the wafer W. Therefore, bottom-up film formation is difficult.

In order to perform the bottom-up film formation, a modifying gas containing no $H_2$ gas, for example, a mixed gas of Ar gas and $O_2$ gas (hereinafter, referred to as "Ar/$O_2$ gas") or a mixed gas of Ar gas and $N_2$ gas (hereinafter, referred to as "Ar/$N_2$ gas"), may be used. However, when Ar/$O_2$ gas or Ar/$N_2$ gas is used as the modifying gas, a seam may be formed in the recess when a part of the silicon oxide film buried in the recess is etched in a later etching step.

Figure 11A:
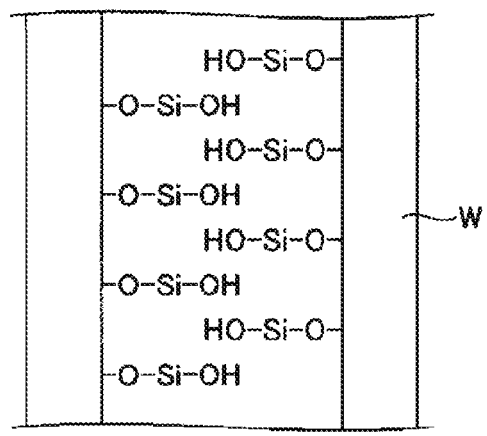
FIGS. 11A to 11C are explanatory views illustrating the mechanism of the film forming method according to an embodiment 1.
Figure 11B:
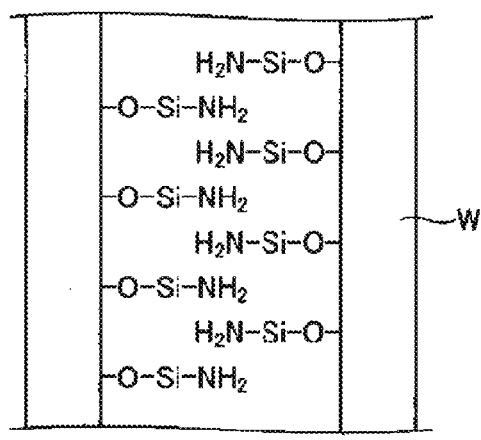
Figure 12A:
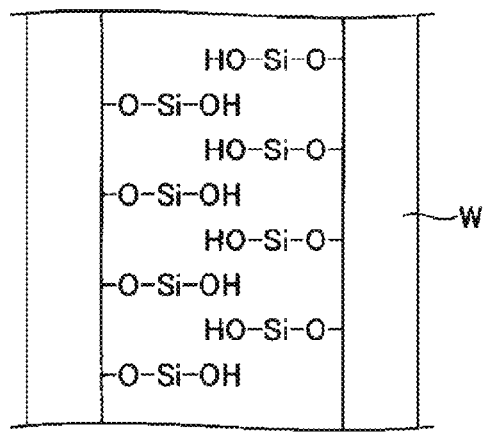
FIGS. 12A to 12C are explanatory views illustrating the mechanism of the film forming method according to an embodiment 2.
Figure 12B:
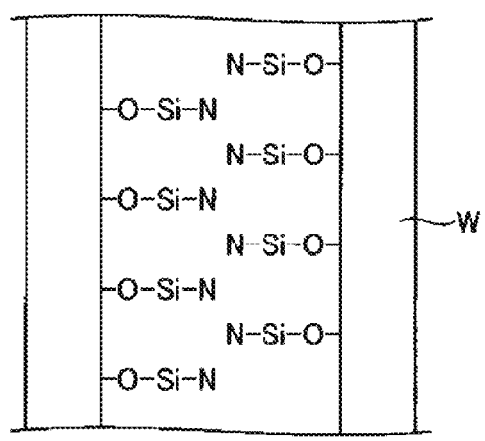

Therefore, in an embodiment, a silicon oxide film is formed by a process including a modifying process in which a mixed gas containing $N_2$ gas and $H_2$ gas (hereinafter, referred to as "$N_2$/$H_2$ gas") is activated by plasma and supplied, and the silicon oxide film fills (is buried in) the recess formed in the surface of the wafer W. Thus, when $N_2$/$H_2$ gas is used in the modifying process, OH groups on the surface of the silicon oxide film (see FIG. 11A) are replaced with $NH_2$ groups by NH active species supplied in the modifying process (see FIG. 11B). On the other hand, when Ar/$N_2$ gas is used in the modifying process, OH groups (see FIG. 12A) on the surface of the silicon oxide film are replaced with N groups in the modifying process (see FIG. 12B).

Figure 11C:
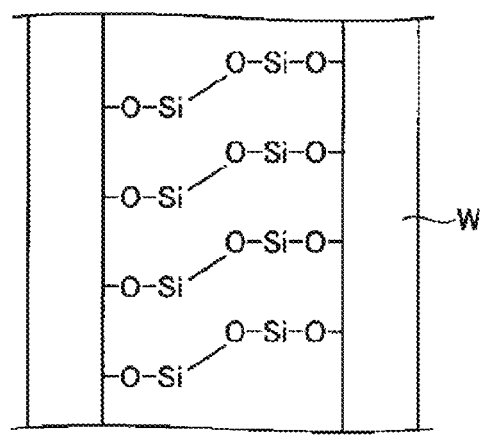

Here, since the bond dissociation energy of a Si—N bond is 302 kJ/mol and the bond dissociation energy of a Si—$NH_2$ bond is 286 kJ/mol, the Si—$NH_2$ bond is more easily replaced by $O_3$ gas than the Si—N bond. Therefore, when $O_3$ gas is supplied to the Si—$NH_2$ bonds, the Si—$NH_2$ bonds are broken, and thus adjacent Si atoms form chemical bonds (Si—O—Si bonds) via O atoms (see FIG. 11C). It is presumed that since a boundary portion occurring due to a physical bond is unlikely to occur in a film as described above, occurrence of a seam can be suppressed in the subsequent etching step.

Figure 12C:
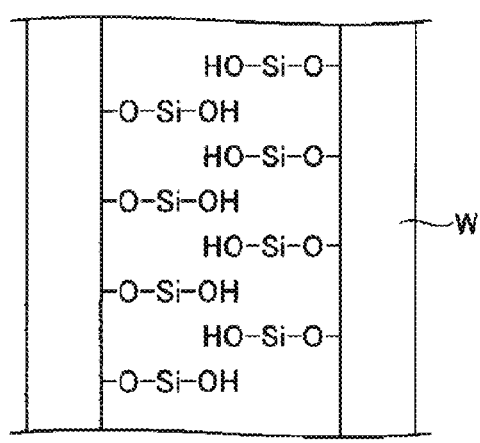

On the other hand, when Ar/$N_2$ gas is used in the modifying process, when $O_3$ gas is supplied to Si—N bonds, it is difficult to form chemical bonds between adjacent Si atoms via O atoms. Therefore, in the film, a boundary portion occurs due to a physical bond in which OH groups having a weaker bonding force than a chemical bond are adjacent to each other (see FIG. 12C). It is presumed that, since a boundary portion due to a physical bond easily occurs in a film as described above, the boundary portion due to the physical bond is more etched than other portions in the later etching process and a seam occurs.

EXAMPLES

Example 1 in which the film forming method according to the embodiment was performed and the results obtained thereby were evaluated will be described. In Example 1, silicon wafers, each having a trench formed in the surface thereof, were used as the wafers W.

First, silicon wafers were placed in the recesses 24 in the rotary table 2 of the film forming apparatus described above, Ar gas was ejected from the separation gas nozzles 41 and 42 as a separation gas, and Ar gas was ejected from the separation gas supply pipe 51 and the purge gas supply pipe 72. In addition, the inside of the vacuum container 1 was controlled to a preset processing pressure by the pressure controller 65. Then, the silicon wafers were heated to the processing temperature by the heater unit 7 while rotating the rotary table 2 clockwise.

After this, an aminosilane gas was supplied from the reaction gas nozzle 31 and an oxidizing gas was supplied from the reaction gas nozzle 32. Further, a modifying gas was supplied from the reaction gas nozzle 33, and high-frequency waves having a frequency of 13.56 MHz were supplied to the antenna 85 of the plasma generation source 80.

Then, a silicon oxide film was buried in each trench by rotating the rotary table 2 such that the silicon wafers repeatedly passed through the aminosilane gas adsorption area P1, the separation area D, the oxidizing gas supply area P2, the plasma processing area P3, and the separation area D in that order. In Example 1, the processing time was adjusted such that the silicon oxide film was buried in a part of each trench.

The processing conditions were as follows.
Processing temperature: 400 degrees C.
Processing pressure: 240 Pa
Aminosilane gas: diisopropylamino silane (DIPAS)
Oxidizing gas: $O_3$ gas
Modifying gas: $Ar/O_2$ gas, $Ar/N_2$ gas, $Ar/N_2/H_2$ gas
High-frequency power: 4000 W
Rotation speed of rotary table 2: 20 rpm Then, the step coverage of the silicon oxide film was evaluated by observing the silicon oxide film buried in a part of each trench using a scanning electron microscope (SEM).

Figure 13:
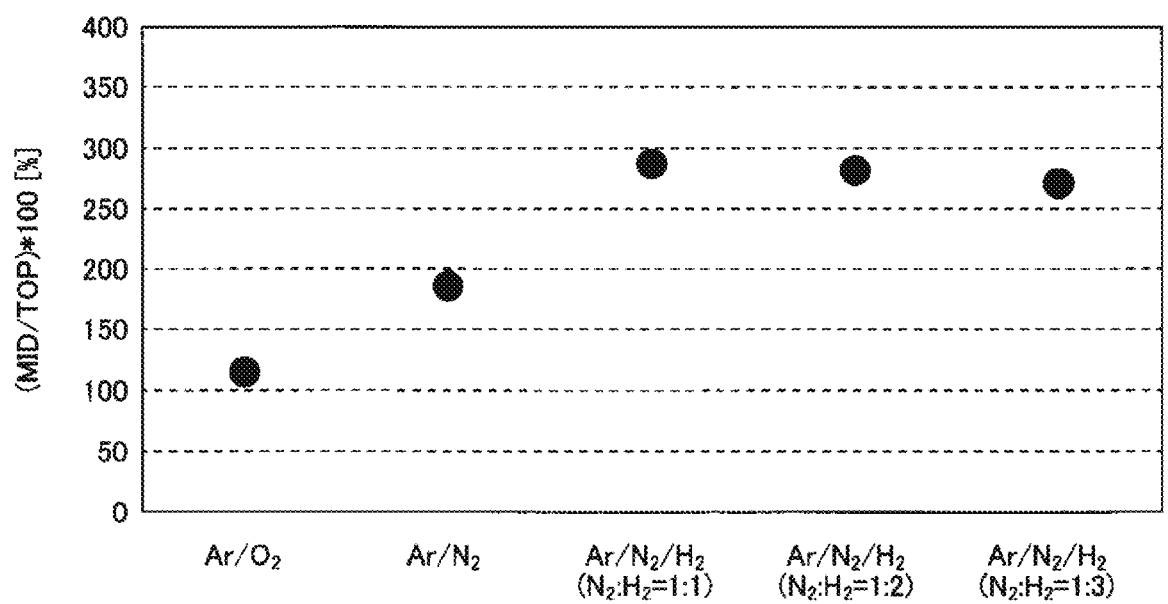
FIG. 13 is a view showing results obtained by performing Example 1.

FIG. 13 is a view showing the implementation results of Example 1, showing a relationship between the types of modifying gases and step coverage. In FIG. 13, the horizontal axis represents the types of modifying gases, and the vertical axis represents the ratio [%] of the film thickness of a central portion (hereinafter, referred to as "MID") to an upper portion (hereinafter, referred to as "TOP") in the height direction of each trench.

As shown in FIG. 13, when $Ar/N_2/H_2$ gas was used, the film thickness ratio of MID to TOP was in the range of 250 to 300% in either case of 1:1, 1:2, or 1:3 in flow ratio of $N_2/H_2$ gas. On the other hand, when $Ar/O_2$ gas was used, the film thickness ratio of MID to TOP was in the range of 100 to 150%. When $Ar/N_2$ gas was used, the film thickness ratio of MID to TOP was in the range of 150 to 200%.

From these results, it can be said that the film thickness ratio of MID to TOP can be increased by using $Ar/N_2/H_2$ gas compared with the case of using $Ar/O_2$ gas or $Ar/N_2$ gas. That is, by using $Ar/N_2/H_2$ gas, bottom-up film formation can be facilitated compared with the case of using $Ar/O_2$ gas or $Ar/N_2$ gas.

Next, Example 2 in which the film forming method according to the embodiment was performed and the results obtained thereby were evaluated will be described. In Example 2, as in Example 1, silicon wafers, each having a trench formed in the surface thereof, were used as wafers W.

First, silicon wafers were placed in the recesses 24 in the rotary table 2 of the film forming apparatus described above, Ar gas was ejected from the separation gas nozzles 41 and 42 as a separation gas, and Ar gas was ejected from the separation gas supply pipe 51 and the purge gas supply pipe 72. In addition, the inside of the vacuum container 1 was controlled to a preset processing pressure by the pressure controller 65. Then, the silicon wafers were heated to the processing temperature by the heater unit 7 while rotating the rotary table 2 clockwise.

After this, an aminosilane gas was supplied from the reaction gas nozzle 31 and an oxidizing gas was supplied from the reaction gas nozzle 32. Further, a modifying gas was supplied from the reaction gas nozzle 33, and high-frequency waves having a frequency of 13.56 MHz were supplied to the antenna 85 of the plasma generation source 80.

Then, a silicon oxide film was buried in each trench by rotating the rotary table 2 such that the silicon wafers repeatedly passed through the aminosilane gas adsorption area P1, the separation area D, the oxidizing gas supply area P2, the plasma processing area P3, and the separation area D in that order. In Example 2, the processing time was adjusted such that the silicon oxide film was completely buried in each trench. The processing conditions are the same as those of Example 1 except for the processing time.

Next, silicon oxide films were removed by etching until the surfaces of the silicon wafers were exposed by a wet etching method using diluted hydrofluoric acid (DHF).

Then, using a scanning electron microscope (SEM), it was identified whether or not a seam had occurred in the silicon oxide film remaining in each trench.

Figure 14:
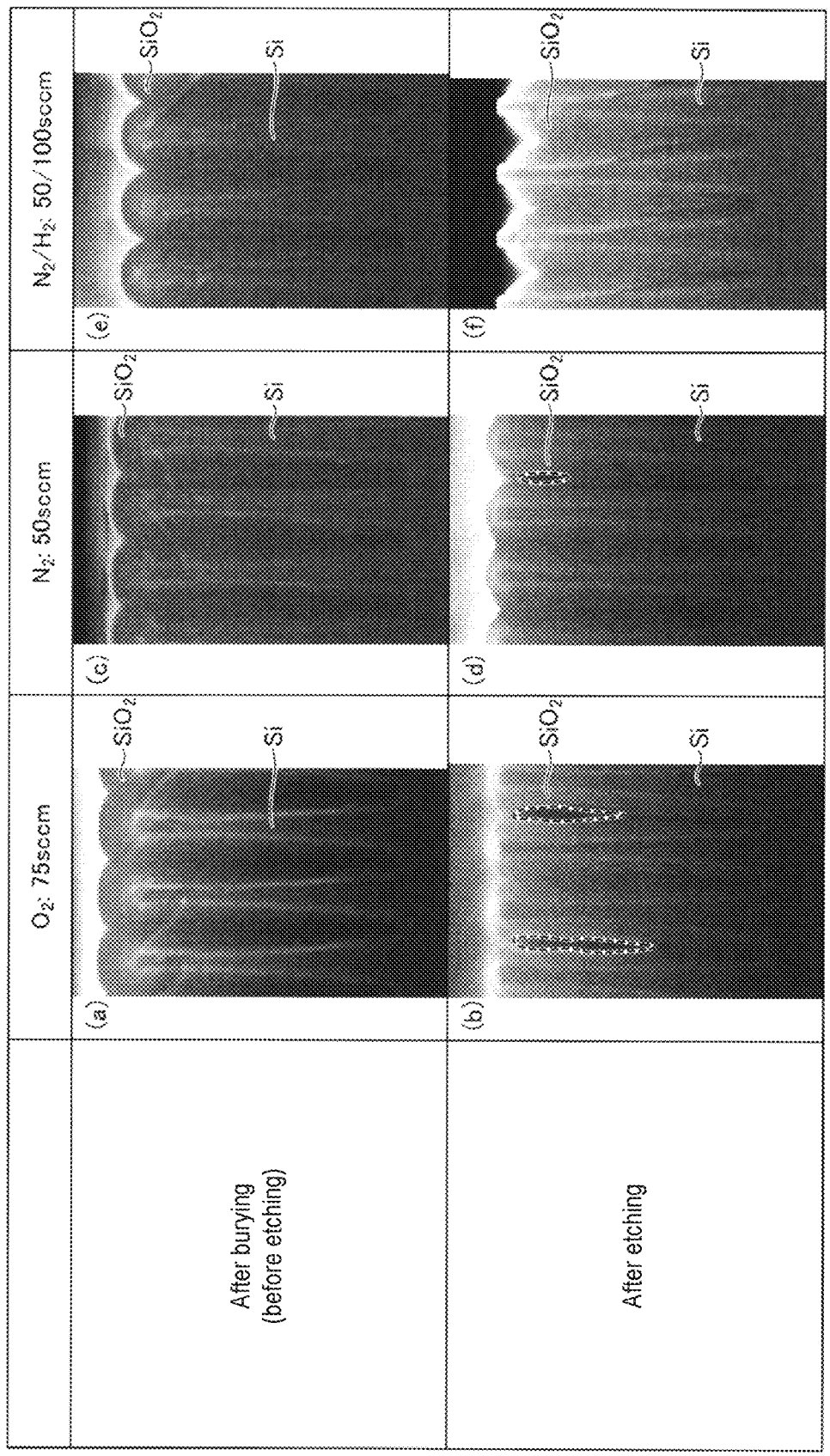
FIG. 14 is a view showing results obtained by performing Example 2.

FIG. 14 is a view showing the results of implementation of Example 2, and are SEM images showing cross sections before and after the etching of the silicon oxide films buried in the trenches. (a) and (b) of FIG. 14 are SEM images before and after etching, respectively, when $Ar/O_2$ gas ($O_2$ gas supply amount: 75 sccm) was used as the modifying gas. (c) and (d) of FIG. 14 are SEM images before and after etching, respectively, when $Ar/N_2$ gas ($N_2$ gas supply amount: 50 sccm) was used as the modifying gas. (e) and (f) of FIG. 14 are SEM images before and after etching, respectively, when $Ar/N_2/H_2$ gas ($N_2$ gas supply amount: 50 sccm, $H_2$ gas supply amount: 100 sccm) was used as the modifying gas. In the SEM images of FIG. 14, a virtual line (the broken line) is imparted to a seam-occurring portion.

First, the filling characteristics of the silicon oxide film in each trench are reviewed. As shown in (a), (c) and (e) of FIG. 14, when $Ar/O_2$ gas, $Ar/N_2$ gas, and $Ar/N_2/H_2$ gas were used as modifying gases, it was possible to bury a silicon oxide film in each trench without a void, a seam, or the like. That is, it can be said that good burying characteristics can be obtained by using any of the above-mentioned gases as the modifying gas.

Next, the effects of etching after burying are reviewed. As shown in (f) of FIG. 14, when $Ar/N_2/H_2$ gas was used as the modifying gas, no seam occurred in the silicon oxide film buried in the trench. On the other hand, as shown in (b) of FIG. 14, when $Ar/O_2$ gas was used as the modifying gas, a large seam occurred in the silicon oxide film buried in the trench. Further, as shown in (d) of FIG. 14, when $Ar/N_2$ gas was used as the modifying gas, a small seam occurred in the silicon oxide film buried in the trench. That is, it can be said that by using $Ar/N_2/H_2$ gas as the modifying gas, it is possible to fill a trench with a silicon oxide film in which a seam is unlikely to occur due to etching after the silicon oxide film is buried in the trench.

According to the present disclosure, it is possible to bury a silicon oxide film in which a seam is unlikely to occur by the subsequent etching process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A film forming method comprising:
  adsorbing an aminosilane gas on a substrate having a recess in a surface of the substrate;
  depositing a silicon oxide film on the substrate by supplying an oxidizing gas to the substrate to oxidize the surface of the substrate and an inner surface of the recess on which the aminosilane gas is adsorbed, the inner surface of the recess including a side surface and a bottom portion; and performing a modifying process of the silicon oxide film by activating a mixed gas including nitrogen gas and hydrogen gas and supplying the activated mixed gas to the silicon oxide film such that a density of OH groups at the bottom portion of the recess and the side surface near the bottom portion is higher than a density of OH groups at the surface of the substrate and the side surface near an opening of the recess.

2. The film forming method of claim 1, wherein NH active species are generated in the performing the modifying process.

3. The film forming method of claim 2, wherein a ratio of a supply amount of the hydrogen gas to a supply amount of the nitrogen gas ranges from 1 to 3.

4. The film forming method of claim 3, wherein the adsorbing the aminosilane gas, the depositing the silicon oxide film, and the performing the modifying process are repeatedly performed.

5. The film forming method of claim 4, wherein the adsorbing the aminosilane gas, the depositing the silicon oxide film, and the performing the modifying process are repeated until the recess is filled with the silicon oxide film.

6. The film forming method of claim 5, further comprising:

supplying a first purge gas and a second purge gas to the substrate between the adsorbing the aminosilane gas and the depositing the silicon oxide film and between the performing the modifying process and the adsorbing the aminosilane gas.

7. The film forming method of claim 6, wherein the substrate is placed on a rotary table provided in a vacuum container along a circumferential direction, wherein, above the rotary table in the vacuum container, along a direction of rotation of the rotary table, an aminosilane gas adsorption area, a first separation area, an oxidizing gas supply area, a plasma processing area, and a second separation area are provided, and wherein the adsorbing the aminosilane gas, the supplying the first purge gas, the depositing the silicon oxide film, the performing the modifying process, and the supplying the second purge gas are repeated by rotating the rotary table.

8. The film forming method of claim 7, wherein a base film composed of a silicon nitride film is formed on the surface of the substrate in advance before performing the adsorbing the aminosilane gas.

9. The film forming method of claim 1, wherein a ratio of a supply amount of the hydrogen gas to a supply amount of the nitrogen gas ranges from 1 to 3.

10. The film forming method of claim 1, wherein the adsorbing the aminosilane gas, the depositing the silicon oxide film, and the performing the modifying process are repeatedly performed.

11. The film forming method of claim 1, wherein the adsorbing the aminosilane gas, the depositing the silicon oxide film, and the performing the modifying process are repeated until the recess is filled with the silicon oxide film.

12. The film forming method of claim 1, further comprising:

supplying a first purge gas and a second purge gas to the substrate between the adsorbing the aminosilane gas and the depositing the silicon oxide film and between the performing the modifying process and the adsorbing the aminosilane gas.

13. The film forming method of claim 1, wherein a base film composed of a silicon nitride film is formed on the surface of the substrate in advance before performing the adsorbing the aminosilane gas.

* * * * *